(12) United States Patent
Mochizuki

(10) Patent No.: US 6,535,222 B1
(45) Date of Patent: Mar. 18, 2003

(54) GRAPHIC METHOD

(75) Inventor: Kiyotaka Mochizuki, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/535,247

(22) Filed: Mar. 27, 2000

(30) Foreign Application Priority Data

Mar. 29, 1999 (JP) ............................................ 11-085400

(51) Int. Cl.$^7$ ................................................ G09G 5/00
(52) U.S. Cl. ...................................... 345/619; 438/942
(58) Field of Search ................................ 345/620–622, 345/624, 441, 958, 473, 619; 716/2, 8, 11; 438/942; 703/1

(56) References Cited

U.S. PATENT DOCUMENTS 5,050,222 A * 9/1991 Lee .............................. 382/21

OTHER PUBLICATIONS

Baird et al., An Artwork Verification System, Jan. 1975, Proceedings of the 12th design automation conference, pp. 414–420.*
Yoshida et al., A Layout Checking System For Large Scale Integrated Circuits, Jun. 1988, Papers on Twenty–five years of electronic design automation, p. 163–171.*
H. S. Baird, Fast algorithm for LSI artwork analysis, Jun. 1988, Papers on Twenty–five years of electronic design automation, p. 154–162.*
Surendra Nahar, Sartaj Sahni, A time and space efficient net extractor, Jul. 1986, Proceedings of the 23rd ACM/IEEE conference on Design automation, p. 411–417.*
Laurin Williams, Automatic VLSI layout verification, Jun. 29–Jul. 1, 1981, Proceedings of the eighteenth design automation conference on Design automation, p. 726–732.*
Foley, van Dam, Feiner, Hughes, Computer Graphics: Principles and Pratice: Second Edition in C, Addison–Wesley, Second Edition, pp. 660–663.*

* cited by examiner

*Primary Examiner*—Mark Zimmerman
*Assistant Examiner*—Linzy McCartney
(74) *Attorney, Agent, or Firm*—Pennie & Edmonds LLP

(57) ABSTRACT

A graphic method for preparing a surface map used to synthesize a masking layer. The proposed structures on a semiconductor surface are mapped as trapezoidal figures on a numerical grid. The first grouping step groups trapezoids into a plurality of groups based on Ymin, and groups are then internally sorted based on Xmin. A to-be-judged group is selected. A intra-group judging step uses a trapezoid as a to-be-judged figure in order of sorting, and trapezoids sorted after the to-be-judged trapezoid as a to-be-compared figures successively in order of sorting, determining if there is intersection and if so incrementally moving the to-be-compared figure, and repetitively executing an intersection judgment processing until there is no intersection or until the to-be-compared figure disappears. An inter-group judging step for using any one of said group sorted before the group-to-be-judged as a to-be-compared group in order of sorting, comparing the Y-values of the lower sides of the trapezoids in the group-a to-be-judged with a maximum Y-coordinate value (Ymax) of a trapezoid in the group-to-be-compared, and executing the intersection judgment processing, and incremental moving, between the trapezoid to be judged and the trapezoid to be compared only when the Y-value of the lower side is smaller than the Ymax. The process is from the step of selecting a group to be judged until there is no group remaining to be judged.

11 Claims, 6 Drawing Sheets

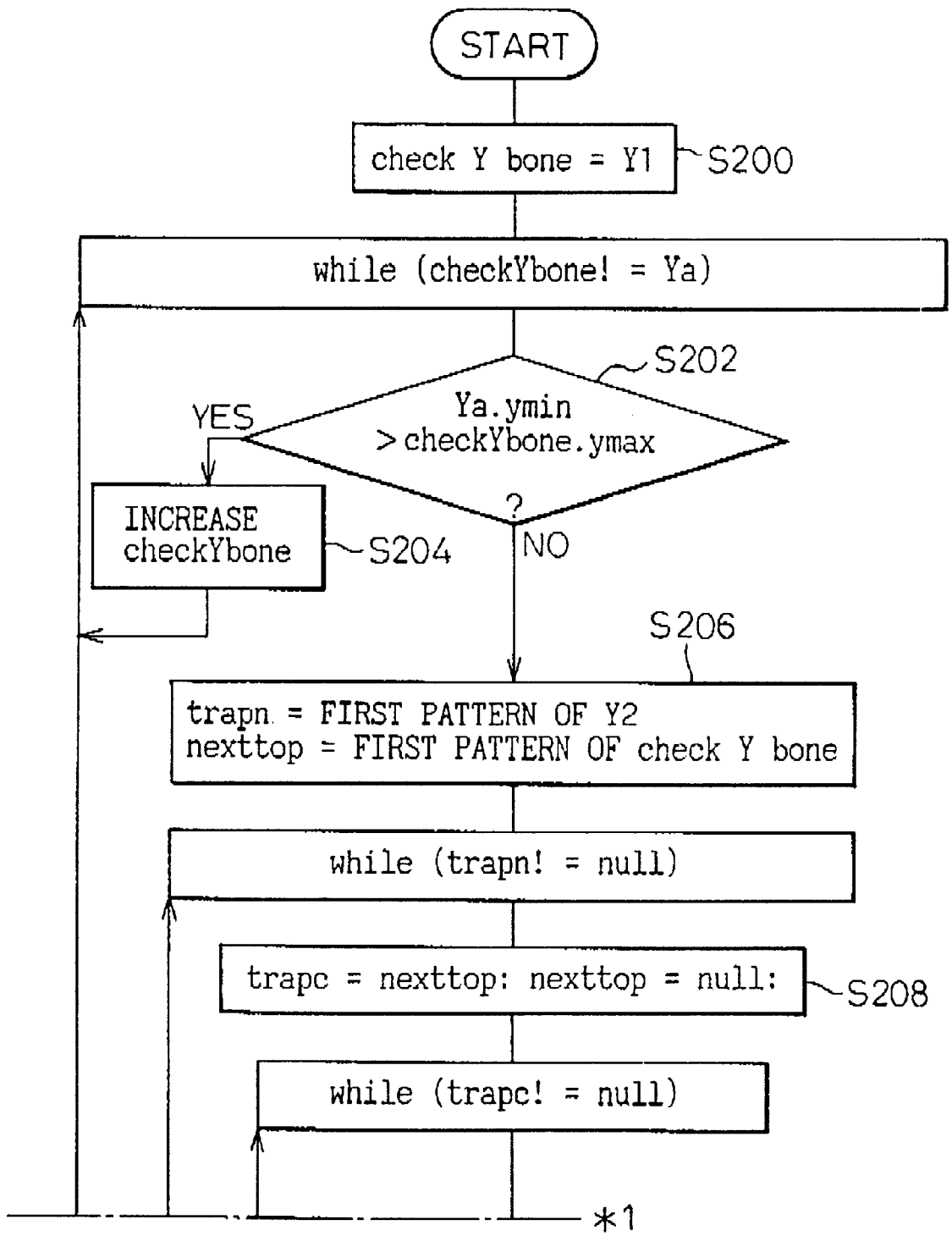

GRAPHIC METHOD

BACKGROUND OF THE INVENTION

1. Field of the Invention

The present invention relates to a method of processing a figure and a recorded medium. More particularly, the present invention relates to a graphic method of judging intersection of trapezoidal figures in a step of synthesizing a masking layer in the production of large-scale integrated circuits (LSTs).

2. Description of the Related Art

Fabrication of an LSI includes a step of synthesizing a masking layer. Synthesis of the masking layer is a "graphic OR" process for synthesizing design data with the layer as a unit and removing portions where the figures overlap. There can be further exemplified "AND processing", "NOT processing" and "XOR processing" in addition to OR processing. The data in the masking layer are expressed as a trapezoid, having parallel upper side and lower side, as a unit. Therefore, figures that are to receive the logical processing, such as OR processing, are trapezoidal figures which are basic figures.

The trapezoidal figures to be put to the logic processing are those figures that overlap one upon the other or are those figures in which one figure is completely included in the other figure. Prior to executing the logic processing, therefore, it is necessary to execute an intersection judgement process concerning whether the trapezoidal figures overlap one upon the other (including one figure being completely included in the other figure as described above).

When it is required to judge the intersecting relationship among a plurality of figures (whether they are overlapping, or whether one figure is completely included in the other figure) as in the step of synthesizing the masking layer, the intersection judgement processing has heretofore been executed for every combination of two figures.

According to the conventional intersection judgement processing executed for every combination of two figures, however, the intersection is judged even for those figures that are located at distant positions on a plane of an X-Y coordinate system on which trapezoidal figures are placed, wastefully consuming processing time and requiring an extended period of time for judging the intersecting relationships of all figures.

A key point for executing the graphic method for judging the intersecting relationship at high speed is to reduce the number of times of executing the intersection judgement processing as much as possible.

SUMMARY OF THE INVENTION

An object of the present invention is to solve the above-mentioned problem and to provide a graphic method capable of judging, at high speed, the intersecting relationships among large number of figures in the synthesis of a masking layer.

In order to solve the above-mentioned problem, the present invention provides a graphic method of judging intersecting relationships among a plurality of trapezoidal figures, having upper and lower sides in parallel with an X-axis, comprising:

a grouping step for classifying those trapezoidal figures having the lower sides of the same Y-coordinate values into the same groups, sorting the groups based on the Y-coordinate values of said lower sides, sorting the trapezoidal figures included in said groups based on minimum X-coordinate values of the trapezoidal figures, and storing them;

a to-be-judged group-determining step for using any one of said groups as a to-be-judged group in order of sorting;

an intra-group judging step for using any one of said trapezoidal figures included in said to-be-judged group as a to-be-judged figure in order of sorting, using any one of the trapezoidal figures in said to-be-judged group sorted after said to-be-judged figure as a to-be-compared figure successively in order of sorting, and repetitively executing intersection judgement processing only when a maximum X-coordinate value of the to-be-judged figure is greater than a minimum X-coordinate value of the to-be-compared figure while comparing the maximum X-coordinate value of the to-be-judged figure with the minimum X-coordinate value of said to-be-compared figure until the maximum X-coordinate value of the to-be-judged figure becomes smaller than the minimum X-coordinate value of the to-be-compared figure or until the to-be-compared figure disappears; and an inter-group judging step for using any one of said groups sorted before said to-be-judged group as a to-be-compared group in order of sorting, comparing the Y-coordinate values of the lower sides of the trapezoidal figures included in said to-be-judged group with a maximum Y-coordinate value of a trapezoidal figure included in said to-be-compared group, and executing the intersection judgement processing between the trapezoidal figures included in said to-be-judged group and the trapezoidal figures included in said to-be-compared group only when the Y-coordinate value of the lower side of said to-be-judged group is smaller than said maximum Y-coordinate value of said to-be-compared group;

said to-be-judged group-determining step through up to said inter-group judging step being repeated until there is no group that can be used as said to-be-judged group in said to-be-judged group-determining step.

In the intra-group judging step, the time-consuming intersection judgement processing is not executed for the figures from the first time but, instead, a maximum X-coordinate value of a to-be-judged figure is compared with a minimum X-coordinate value of a to-be-compared figure, which is easy to execute, and the intersection judgement processing is executed only when the maximum X-coordinate value of the to-be-judged figure is larger than the minimum X-coordinate value of the to-be-compared figure, i.e., only when there is a probability of intersection. Therefore, the intersection judgement processing is not executed for the figures which apparently have no probability of intersection. similarly, further, the intersection judgement processing is terminated in the to-be-judged group when the maximum X-coordinate value of the to-be-judged figure becomes smaller than the minimum X-coordinate value of the to-be-compared figure and there is apparently no probability of intersection. Thus, the processing time can be shortened as compared with when the intersection judgement processing is executed for all of the figures in the to-be-judged group.

In the inter-group judging step, further, a Y-coordinate value of the lower side of a trapezoidal figure included in the to-be-judged group is compared with a maximum Y-coordinate value of a trapezoidal figure included in the to-be-compared group, which is easy to process, at the time of judging the intersection between the two groups, i.e., between trapezoidal figure in the to-be-judged group and the trapezoidal figure in the to-be-compared group, and the intersection judgement processing is executed between the trapezoidal figure included in the to-be-judged group and the trapezoidal figure included in the to-be-compared group only when the Y-coordinate value of the lower side of the to-be-judged group is smaller than the maximum Y-coordinate value of the to-be-compared group, i.e., only when there is a probability of intersection. Therefore, the intersection judgement processing is not executed for the trapezoidal figures included in the groups which apparently have no probability of intersection Thus, the processing time can be shortened as compared with when the intersection judgement processing is executed for all of the trapezoidal figures included in the two groups.

In the present invention, further, the inter-group judging step uses any one of the trapezoidal figures included in the to-be-judged group as a to-be-judged figure successively in order of sorting, uses any one of the trapezoidal figures included in the to-be-compared group as a to-be-compared figure successively in order of sorting when the Y-coordinate value of the lower side of the to-be-judged group is smaller than a maximum Y-coordinate value of the to-be-compared group, judges the intersecting relationship between the to-be-judged figure and the to-be-compared figure along the direction of X-axis, judges whether the maximum Y-coordinate value of the to-be-compared figure is greater than the Y-coordinate value of the lower side of the to-be-judged group only when there is a probability of intersection, and executes the intersection judgement processing between the to-be-judged figure and the to-be-compared figure only when the maximum Y-coordinate value of the to-be-compared figure is greater than the Y-coordinate value of the lower side of the to-be-judged group.

According to the invention, further, the probability of intersection is judged between the to-be-judged figure and the to-be-compared figure, which is easy to process, it is judged whether the maximum Y-coordinate value of the to-be-compared figure exceeds the Y-coordinate value of the lower side of the to-be-judged group, i.e., the probability of intersection is judged along the direction of Y-axis prior to executing the intersection judgement processing for the to-be-judged figures in the to-be-judged groups and for the to-be-compared figures in the to-be-compared groups, and the intersection judgement processing is executed only when there is a probability of intersection. Therefore, the intersection judgement processing is not executed for the to-be-judged figures and the to-be-compared figures that apparently have no probability of intersection.

In the invention, further, a to-be-compared figure that is compared first with a to-be-judged figure in the inter-group judging step is a trapezoidal figure which is sorted first among the trapezoidal figures in the to-be-compared group that is judged for its intersecting relationship with a to-be-judged figure just preceding said to-be-judged figure, but excluding those trapezoidal figures of which maximum X-coordinate values are smaller than the minimum X-coordinate value of the to-be-judged figure.

Thus, according to the invention, the intersecting relationship is not judged for all trapezoidal figures included in a to-be-compared group concerning the trapezoidal figures included in the to-be-judged group. Instead, when there are trapezoidal figures of which maximum X-coordinate values are smaller than the minimum X-coordinate value of the to-be-judged figure among the trapezoidal figures in the to-be-compared group which is judged for its intersecting relationship with a to-be-judged figure just preceding the above to-be-judged figure, these trapezoidal figures and the trapezoidal figures included in the to-be-compared group and sorted earlier than the above trapezoidal figures, are not judged for their intersecting relationship. Therefore, the number of times of the intersection judgement processing can be decreased, and the processing time can be shortened.

BRIEF DESCRIPTION OF THE DRAWINGS

FIGS. 3a and 3b are separate flow charts illustrating the operation of an inter-group judging step of FIG. 1;

DESCRIPTION OF THE PREFERRED EMBODIMENTS

A preferred embodiment of a graphic method according to the invention will now be described, in detail, with reference to the accompanying drawings.

Overall Processing Flow

Figure 1:
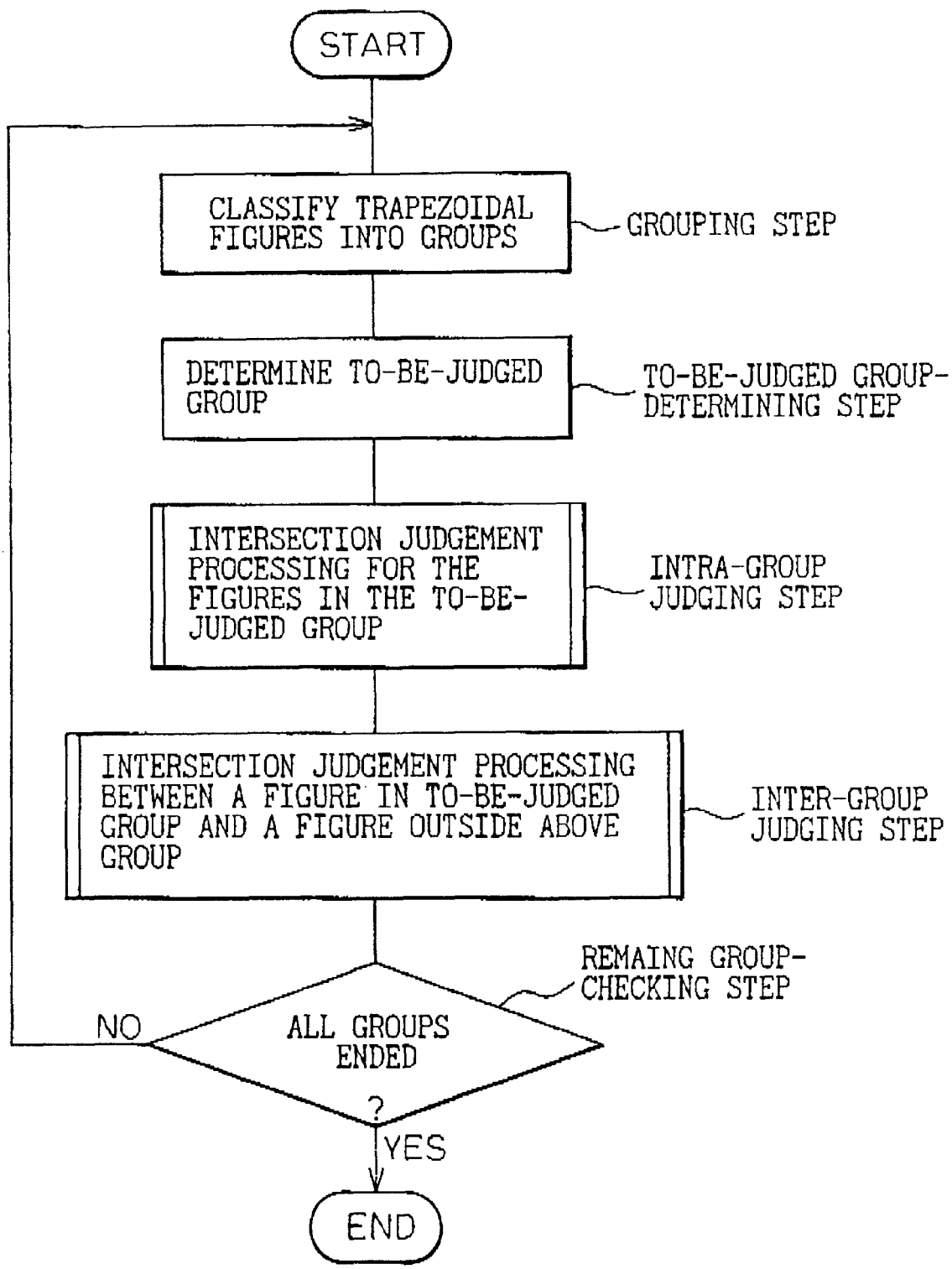
FIG. 1 is a flow chart illustrating the whole operation of the graphic method according to the present invention.
Figure 4:
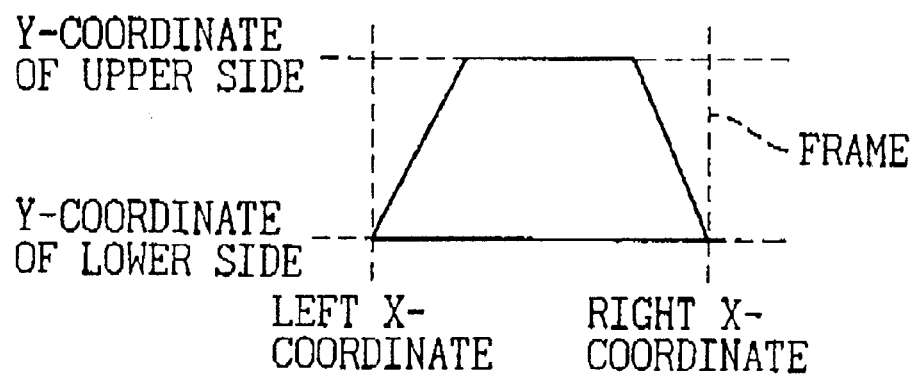
FIG. 4 is a diagram illustrating a trapezoidal figure treated by the graphic method of FIG. 1.

First, described below with reference to FIG. 1 is an outline of the overall processing flow of the graphic method for judging the intersecting relationship among the figures. The figures to be treated here are a plurality of trapezoids (see FIG. 4) arranged on a plane of an X-Y coordinate system and having upper sides and lower sides in parallel with the x-axis like those of the prior art. In the trapezoid shown in FIG. 4:

"LEFT X-COORDINATE" refers to X-coordinate of left end of upper side or of left end of lower side of the trapezoid whichever is smaller;

"RIGHT X-COORDINATE" refers to X-coordinate of right end of upper side or of right end of lower side of the trapezoid whichever is larger; and "FRAME" refers to a minimum rectangle including the trapezoid.

Figure 5:
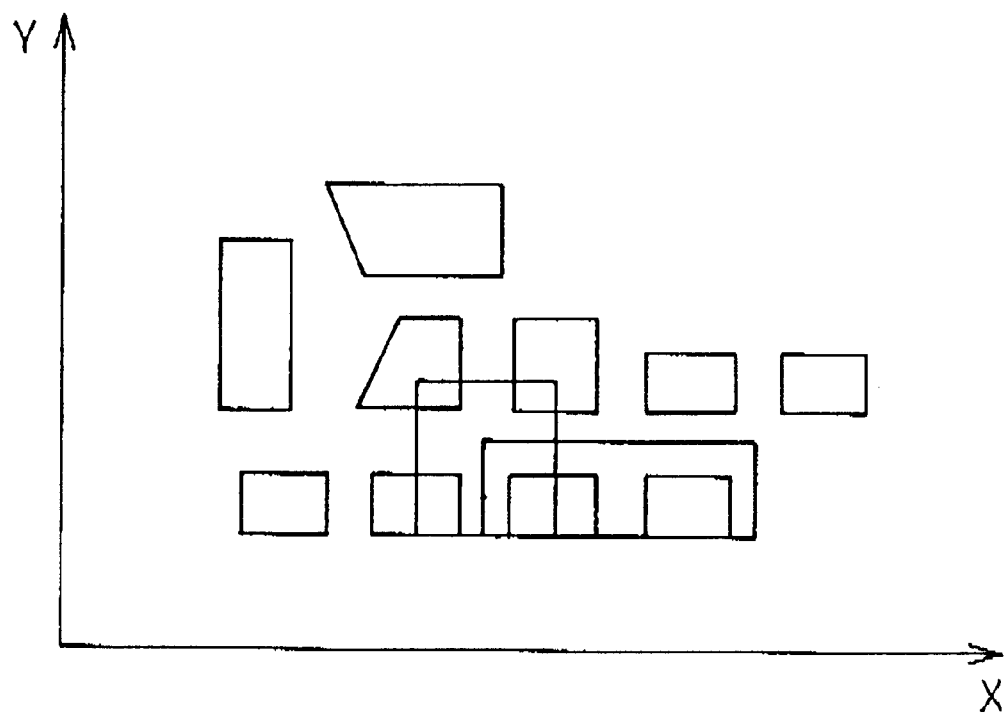
FIG. 5 illustrates a model in which a plurality of trapezoidal figures are arranged on an X-Y coordinate for explaining the operation of the graphic method of the invention.

The contents of processing will now be described by using a plurality (twelve) of trapezoidal figures arranged on the X-Y coordinate plane as shown in FIG. 5. AS shown in FIG. 5, squares, rectangles and parallelograms having upper sides and lower sides in parallel with the X-axis are included in the definition of "trapezoidal figure" referred to in the present invention and, besides, triangles having upper sides or lower sides in parallel with the X-axis are treated as trapezoidal figures with their remaining sides having a zero length and are included in the definition of "trapezoidal figure".

Figure 6:
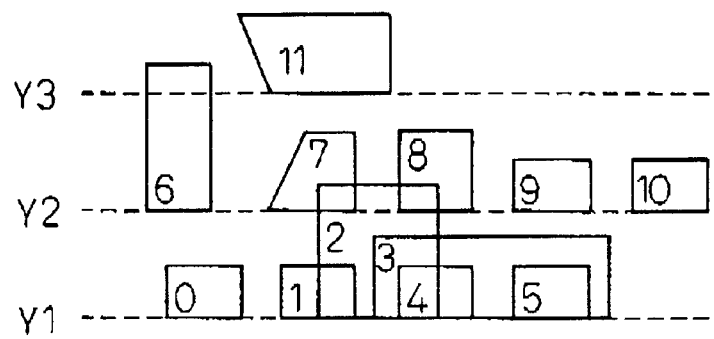
FIG. 6 is a diagram illustrating a state where the trapezoidal figures of FIG. 5 are sorted relying on the Y-coordinate values of the lower sides of the trapezoidal figures and the minimum X-coordinate values thereof in a grouping step of FIG. 1.

First, in a grouping step as shown in FIG. 6, the trapezoidal figures with their lower sides having the same Y-coordinate values are sorted into the same groups. In the case of FIG. 6, the trapezoidal figures are classified into a group having lower sides of a Y-coordinate value of Y1 (hereinafter referred to as group 1, or is described in the drawing as Y-bone), a group of Y2 (hereinafter referred to as group 2) and a group of Y3 (hereinafter referred to as group 3).

Figure 7:
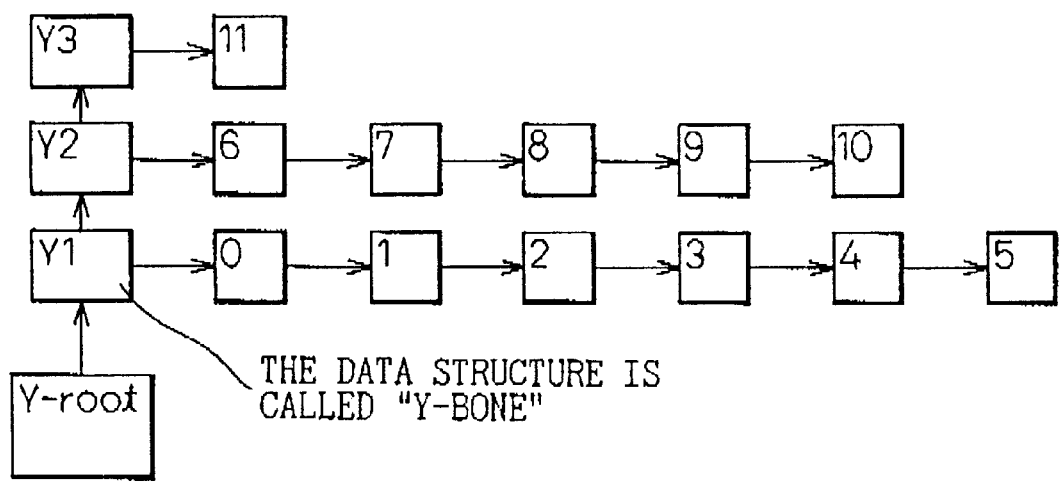
FIG. 7 is a imaginary view of a state storing the plurality of trapezoidal figures that are sorted of FIG. 6.

In this step, the groups are further sorted based on the Y-coordinate values of the lower sides used for the classification, as shown in FIG. 7, and the trapezoidal figures included in each of the groups are sorted based on the minimum X-coordinate values of the trapezoidal figures and are stored. For instance, the groups are sorted in order of increasing Y-coordinate values of the lower sides, and the trapezoidal figures included in each group are arranged in order of increasing minimum X-coordinate values. Here, a minimum X-coordinate value refers to a left X-coordinate in FIG. 4, i.e., refers to the left end of the upper side or the left end of the lower side constituting the trapezoidal figure in FIG. 4 whichever is smaller. A maximum X-coordinate value refers to a right X-coordinate, i.e., refers to the right end of the upper side or the right end of the lower side of the trapezoidal figure whichever is larger.

As a result, in the storage region of the group 1 are related and stored the data of six trapezoidal figures of numbers 0 to 5 in order of sorting. The data of the trapezoidal figures may be, for example, identifiers attached to the trapezoidal figures.

Further, in the storage region of the group 2 are similarly related and stored the data of five trapezoidal figures of numbers 6 to 10 in order of sorting.

In the storage region of the group 3 are stored the data of only one trapezoidal figure of a number 11.

In the next to-be-judged group-determining step, any one of the groups is used as a to-be-judged group in order of sorting. That is, in this embodiment, the group 1 is, first, sorted as the to-be-judged group and, then, the group 2 and group 3 are sorted to be the to-be-judged groups, successively, In the next intra-group judging step, the intersecting relationship is judged among the trapezoidal figures included in the to-be-judged group.

If this step is roughly described, a trapezoidal figure among those included in the to-be-judged group is used as a to-be-judged figure in order of sorting, and a trapezoidal figure that succeeds the to-be-judged figure in order of sorting in the to-be-judged group is used as a to-be-compared figure successively in order of sorting. Then, the intersection judgement processing is executed when a maximum X-coordinate value of the to-be-judged figure is greater than a minimum X-coordinate value of the to-be-compared figure, i.e., only when there is a probability of intersection while comparing the maximum X-coordinate value of the to-be-judged figure with the minimum X-coordinate value of the to-be-compared figure, until the maximum X-coordinate value of the to-be-judged figure becomes smaller than the minimum X-coordinate value of the to-be-compared figure or until the to-be-compared figure disappears.

The time-consuming intersection judgement processing is not executed from the first for all figures but, instead, a maximum X-coordinate value of the to-be-judged figure is compared with a minimum X-coordinate value of the to-be-compared figure, which is easy to carry out, and the intersection judgement processing is executed when the maximum X-coordinate value of the to-be-judged figure is greater than the minimum X-coordinate value of the to-be-compared figure, i.e., only when there is a probability of intersection. Thus, the intersection judging processing is not executed for the figures which obviously do not have a probability of intersection. Similarly, further, the intersection judgement processing is terminated in the to-be-judged group when the maximum X-coordinate value of the to-be-judged figure becomes smaller than the minimum X-coordinate value of the to-be-compared figure and there is obviously no probability of intersection. Therefore, the processing time is shortened compared with when the intersection judgement processing is executed for all of the figures in the to-be-judged group.

The next inter-group judging step is for judging the intersecting relationship between a trapezoidal figure included in the to-be-judged group and a trapezoidal figure included in a group other than the to-be-judged group.

In this step, the group which is judged for its intersecting relationship with the to-be-judged group is one of the groups preceding the to-be-judged group in order of sorting. One of the groups preceding the to-be-judged group in order of sorting is used as a to-be-compared group successively in order of sorting, and a Y-coordinate value of the lower side of the trapezoidal figure included in the to-be-judged group is compared with a maximum Y-coordinate value of a trapezoidal figure included in the to-be-compared group. Then, the intersection judgement processing is executed between a trapezoidal figure included in the to-be-judged group and a trapezoidal figure included in the to-be-compared group only when the Y-coordinate value of the lower side of the to-be-compared group is smaller than the maximum Y-coordinate value of the to-be-compared group, i.e., only when there is a probability of intersection.

After the inter-group judging step has finished, a remaining group-checking step judges whether any group to be used as a to-be-judged group exists in the to-be-judged group-determining step. When there exists a group to be used as the to-be-judged group, the routine returns back to the to-be-judged group-determining step to repeat the above-mentioned processings. The processing ends when there is no group that is to be used as the to-be-judged group.

According to this processing method, the Y-coordinate value of the lower side of the trapezoidal figure included in the to-be-judged group is, first, compared with the maximum Y-coordinate value of the trapezoidal figure included in the to-be-compared group at the time of judging the intersecting relationship between the two groups, i.e., between the to-be-judged group and the to-be-compared group, and the intersection judgement processing is executed between the trapezoidal figure included in the to-be-judged group and the trapezoidal figure included in the to-be-compared group when the Y-coordinate value of the lower side of the to-be-judged group is smaller than the maximum Y-coordinate value of the to-be-compared group, i.e., only when there is a probability of intersection. Therefore, the intersection judgement processing is not effected for the trapezoidal figures included in the groups that obviously have no probability of intersection. Accordingly, the processing time can be shortened compared with when the intersection judgement processing is effected for all trapezoidal figures included in the two groups.

Next, described below in detail are the above-mentioned intra-group judging step and the inter-group judging step.

Intra-group Judging Step

First, the intra-group judging step will be described below with reference to a flow chart of FIG. 2. Here, Ya is a to-be-judged group.

First, one of the trapezoidal figures included in the to-be-judged group is used as a to-be-judged figure (expressed as trapb in FIG. 2) in order of sorting (step 100). Concretely speaking, when the to-be-judged group is the group 1, a trapezoidal figure of a number 0 becomes the first to-be-judged figure. Similarly, in the case of the group 2, a trapezoidal figure of a number 6 becomes the to-be-judged figure and in the case of the group 3, a trapezoidal figure of a number 11 becomes the to-be-judged figure.

Then, the Y-coordinate value of the upper side of the trapezoidal figure that first becomes the to-be-judged figure is temporarily stored as a maximum value UpYmax which is a variable (step 102).

Then, the routine enters into a loop of repetitive processing using trapb as a variable (in this embodiment which uses C-language, this processing is expressed as "while processing" in the drawing). Thereafter, one of the trapezoidal figures included in the to-be-judged group is used as a to-be-judged figure successively in order of sorting, and the processing included in the loop of repetitively processing the trapb is repeated until the trapezoidal figure included in the to-be-judged group disappears. In the case of the group 1, for example, the trapezoidal figures are successively sorted in order of 1→2→3→4→5 if mentioned by the numbers of the trapezoidal figures until no trapezoidal figure is included in the group 1. At step 104, the Y-coordinate value of the upper side of the trapezoidal figure which is used as the to-be-judged figure is compared with the Y-coordinate value stored as the variable UpYmax. As a result, when the Y-coordinate value of the upper side of the to-be-judged figure is greater, the value of variable UpYmax is updated to the Y-coordinate value of the upper side of the to-be-judged figure at step 106. Through these steps 104 and 106, the Y-coordinate value of the upper side of the trapezoidal figure that is used as the to-be-judged figure is stored while being updated to a variable UpYmax, and a maximum Y-coordinate value is found out of the Y-coordinate values of the upper sides of the trapezoidal figures included in the to-be-judged group.

Figure 2:
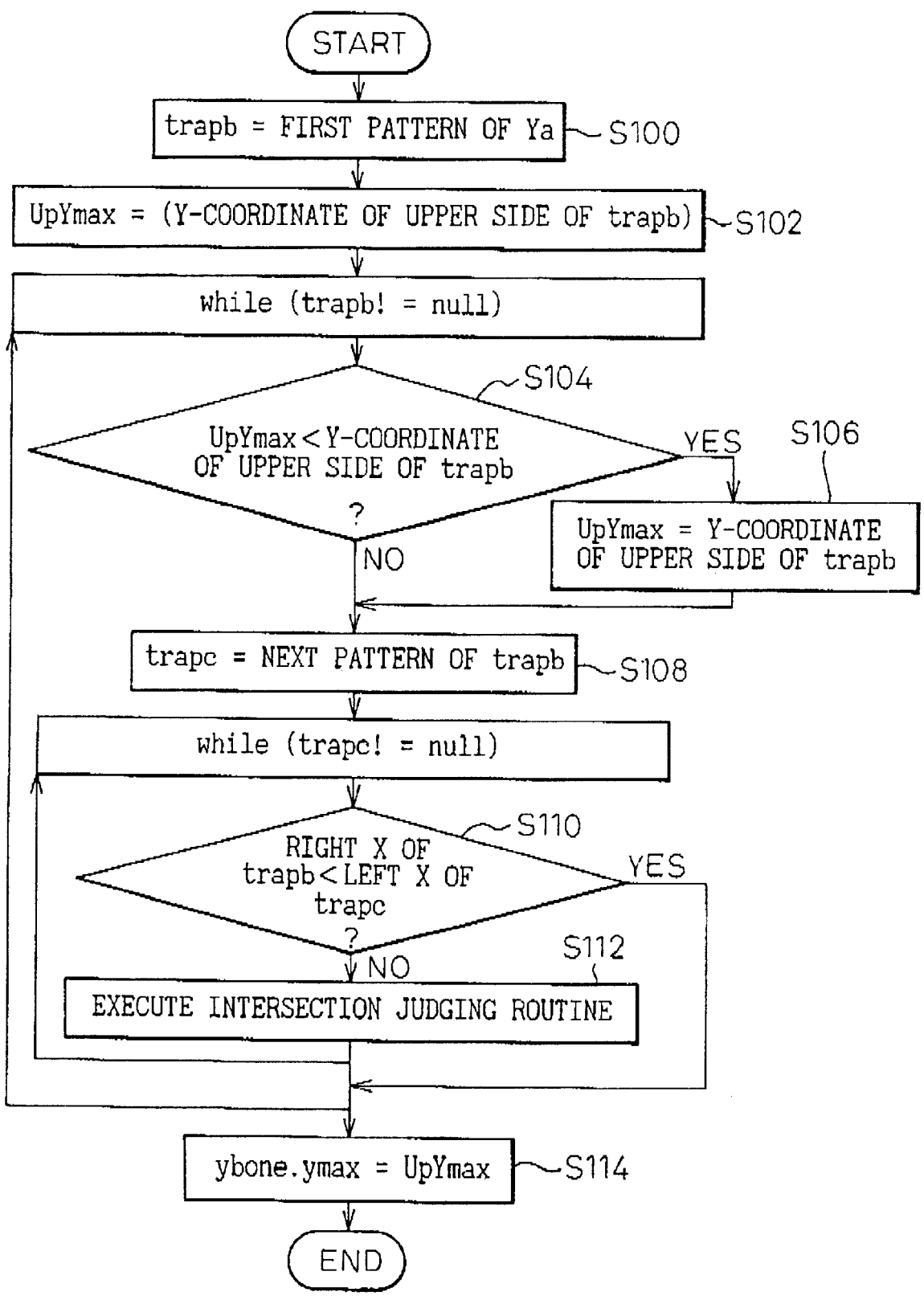
FIG. 2 is a flow chart illustrating the operation of an intra-group judging step of FIG. 1.

Next, at step 108, a next trapezoidal figure of the to-be-judged figure trapb in the to-be-judged group in order of sorting is used as a to-be-compared figure (expressed as trapc in FIG. 2). In the group 1, for example, when the to-be-judged figure is the trapezoidal figure of the number 2, then, the trapezoidal figure of the number 3 is used as the to-be-compared figure.

The routine then enters into a loop of repetitive processing using trapc as a variable. Thereafter, the processing included in the loop of repetitively processing the trapc is repeated while successively using one of the trapezoidal figures succeeding the trapezoidal figure that was used as the to-be-compared figure in the step 108, as the to-be-compared figure in order of sorting until no trapezoidal figure is included in the to-be-judged group.

In the processing in the loop for repetitively processing the trapc, first, a maximum X-coordinate value (right X-coordinate) of the to-be-judged figure is compared with a minimum X-coordinate value (left X-coordinate) of the to-be-compared figure (step 110).

The intersection judgement processing is executed at step 112 when the maximum X-coordinate value of the to-be-judged figure is greater than the minimum X-coordinate value of the to-be-compared figure, i.e., only when there is a probability of intersection.

As a result of comparison at step 110, when the maximum X-coordinate value of the to-be-judged figure becomes smaller than the minimum X-coordinate value of the to-be-compared figure, there is no probability of developing an intersecting relationship between the to-be-judged figure and the present to-be-compared figure and, besides, the intersecting relationship does not occur even between the to-be-judged figure and a trapezoidal figure that succeeds the trapezoidal figure which is now used as the to-be-compared figure in order of sorting. Therefore, the routine goes out of the loop of repetitively processing the trapc.

Then, instead of the trapezoidal figure that is now used as the to-be-judged figure, the next trapezoidal figure in order of sorting is used as a new to-be-judged figure, and the routine returns back to step 104 to repeat the processing up to step 112.

The loop for repetitively processing the trapb is repeated until no trapezoidal figure is included in the to-be-judged group, i.e., until the trapezoidal figures are all used as the to-be-judged figures.

When the to-be-judged group includes no trapezoidal figure that is to be used as the to-be-judged figure, then, the routine goes out of the loop of repetitively processing the trapb. The routine, then, proceeds to step 114 where a maximum Y-coordinate value among the Y-coordinate values of upper sides of trapezoidal figures included in the to-be-judged group stored as the variable UpYmax, is stored as the maximum Y-coordinate value (ybone, ymax) of the group which is used as the to-be-judged group.

In the foregoing were described the contents of processing in the intra-group judging step.

Inter-group Judging Step

Figure 3B:
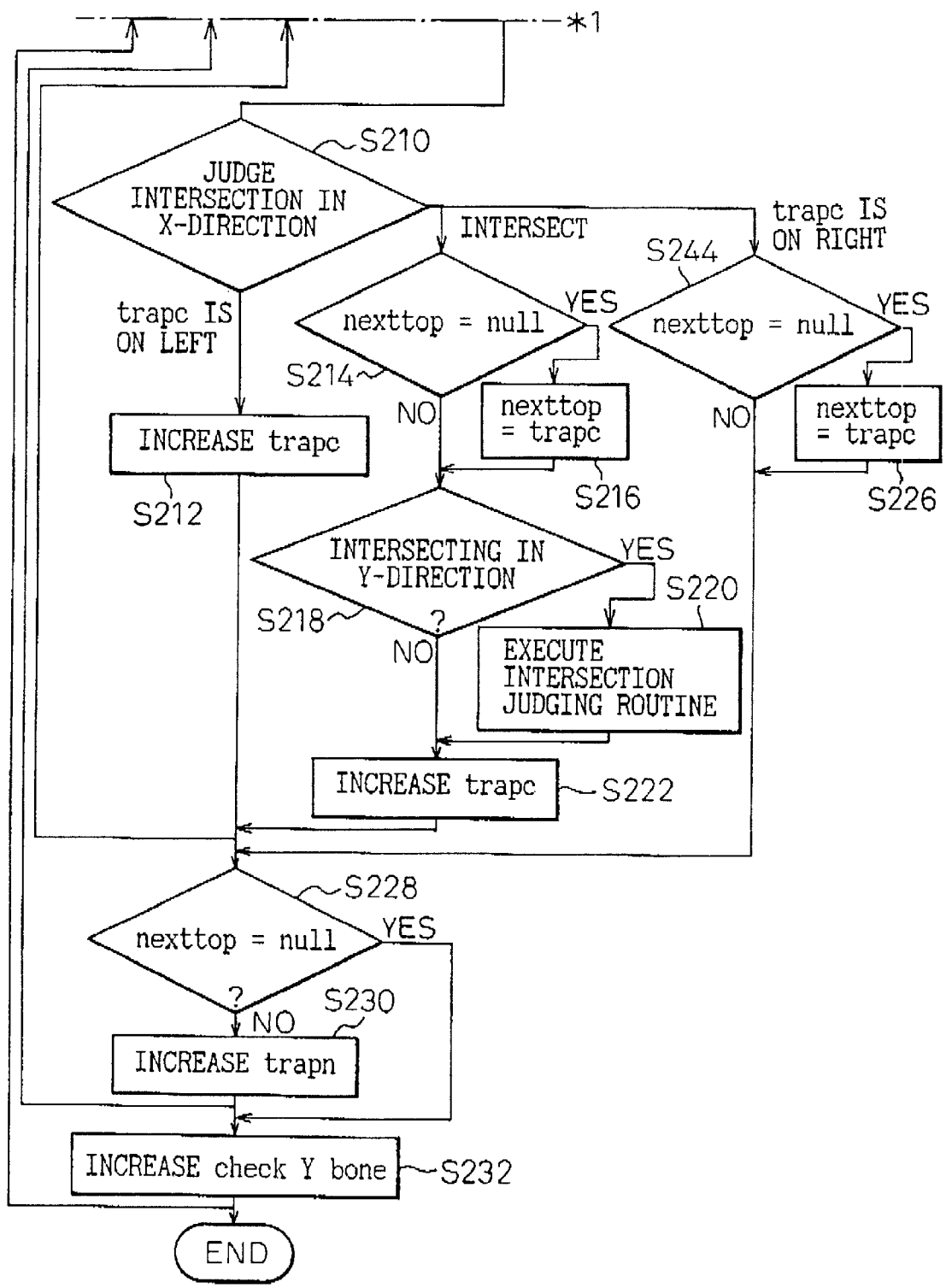

Next, the inter-group judging step will be described with reference to a flow chart of FIGS. 3a and 3b. Here, check Y bone is a to-be-compared group which will be compared with a to-be-judged group Ya.

First, at step 200, any group preceding the to-be-judged group in order of sorting is used as a to-be-compared group (check Y bone) in order of sorting. For example, when the group 3 is a to-be-judged group, the group 1 becomes the to-be-compared group and, next, the group 2 becomes the to-be-compared group. In the case of the group 1 which is sorted first, there exists no preceding group and no inter-group judgement is executed.

Next, the routine enters into a loop of repetitive processing using check Y bone as a variable. Thereafter, the processing included in the loop of repetitively processing check Y bone is repeated up to a group just preceding the to-be-judged group while successively updating the to-be-compared group. For example, when the group 2 is a to-be-judged group, the group that becomes the to-be-compared group is the group 1 only. Therefore, the intersection is judged between the groups using the group 1 as the to-be-compared group.

In the processing in the loop of repetitively processing check Y bone, first, a Y-coordinate value of the lower side of a trapezoidal figure included in the to-be-judged group is compared with a maximum Y-coordinate value of a trapezoidal figure included in the to-be-compared group (step 202). The to-be-compared group is necessarily the to-be-judged group, and a maximum Y-coordinate value has been found among the Y-coordinate values of upper sides of trapezoidal figures included in the group in the intra-group judging step.

When the Y-coordinate value of the lower side of the to-be-judged group is greater than the maximum Y-coordinate value of the to-be-compared group as a result of comparison at step 202, there is no probability of intersection between any trapezoidal figure included in the to-be-judged group and any trapezoidal figure included in the to-be-compared group. Therefore, the intersection judgement processing is not executed for the to-be-compared group. When there is a group next of the group that is now the to-be-compared group, and when this group is not the to-be-judged group, then, the above next group is used as a new to-be-compared group (step 204), and the routine returns back to step 202 to start again the processing for the trapezoidal figures between the groups. When the above next group is the to-be-judged group, there is no group to be used as to-be-compared group. Therefore, the routine goes out of the loop of repetitively processing check Y bone, and the inter-group judging step ends.

When the Y-coordinate value of the lower side of the to-be-judged group is smaller than the maximum Y-coordinate value of the to-be-compared group as a result of comparison at step 202, there is a probability of intersection between a trapezoidal figure included in the to-be-judged group and a trapezoidal figure included in the to-be-compared group, and the processing for judging the intersecting relationship is executed between a trapezoidal figure in the to-be-judged group and a trapezoidal figure in the to-be-compared group.

Concretely speaking, a trapezoidal figure sorted first in the to-be-judged group is used as a to-be-judged figure (trapn in FIGS. 3a and 3b) and a trapezoidal figure sorted first in the to-be-compared group is used as a to-be-compared figure. A first to-be-compared figure (identifier) in the to-be-compared group is temporarily substituted for nexttop which is a variable (step 206). Here, nexttop represents a first trapezoidal figure in the to-be-compared group for which the intersection is judged by a trapn next to the present trapn.

Then, the routine enters into a loop of repetitive processing using trapn as a variable. Thereafter, the processing included in the loop of repetitively processing the trapn is repeated until, basically, there is no trapezoidal figure in the to-be-judged group while successively updating the to-be-judged figure.

At step 208, first, the value nexttop is substituted for trapc and the data null is substituted for nexttop. Here, trapc is a variable representing a trapezoidal figure in the to-be-compared group which is to be actually judged for its intersection with the to-be-judged figure trapn, i.e., represents a to-be-compared figure.

Next, the routine enters into a loop of repetitive processing using trapc as a variable. Thereafter, the processing included in the loop of repetitively processing trapc is repeated until there is basically no trapezoidal figure in the to-be-compared group while successively updating the to-be-compared figures.

At step 210, first, the intersecting relationship is judged between the to-be-judged figure and the to-be-compared figure along the direction of X-axis. Concretely speaking, a probability of an intersection is judged by using the minimum X-coordinate value and the maximum X-coordinate value of the to-be-judged figure and by using the minimum X-coordinate value and the maximum X-coordinate value of the to-be-compared figure.

When the maximum X-coordinate value of the to-be-compared figure is smaller than the minimum X-coordinate value of the to-be-judged figure (when the to-be-compared figure is on the left side of the to-be-judged figure) as a result of judgement at step 210, the probability of intersection is zero, In this case, therefore, it is judged at step 212 whether there is a trapezoidal figure next to the trapezoidal figure that is now used as the to-be-compared figure. When there a next trapezoidal figure exists, this next trapezoidal figure is used as a new to-be-compared figure exists, and the routine returns back to step 210. When a next trapezoidal figure does not exist, it is presumed that the judgement of the intersecting relationship has ended between the present to-be-judged figure and the trapezoidal figure in the present to-be-compared group, and the routine goes out of the loop of repetitively processing trapc.

In the following three cases, i.e., when the maximum X-coordinate value of the to-be-compared figure is greater than the minimum X-coordinate value of the to-be-judged figure and the minimum X-coordinate value of the to-be-compared figure is smaller than the minimum X-coordinate value of the to-be-judged figure (case 1), when the maximum X-coordinate value of the to-be-compared figure is greater than the maximum X-coordinate value of the to-be-judged figure and the minimum X-coordinate value of the to-be-compared figure is smaller than the maximum X-coordinate value of the to-be-judged figure (case 2), and when the maximum X-coordinate value of the to-be-compared figure is smaller than the maximum X-coordinate value of the to-be-judged figure and the minimum X-coordinate value of the to-be-compared figure is greater than the minimum X-coordinate value of the to-be-judged figure (case 3) as a result of judgement at step 210, then, there is a probability of an intersecting relationship between the two trapezoidal figures when the judgement is based only upon the X-coordinate along the direction of X-axis.

In the case of this judgement, therefore, the intersecting relationship is further judged along the direction of Y-axis at step 218. Concretely speaking, it is judged whether a maximum Y-coordinate value of the to-be-compared figure is greater than the Y-coordinate value of the lower side of the to-be-judged group. When the maximum Y-coordinate value of the to-be-compared figure is greater than the Y-coordinate value of the lower side of the to-be-judged group, there is a probability of intersecting relationship between the two trapezoidal figures when the judgement is based on the Y-coordinate. At step 220, therefore, the intersection judgement processing is actually executed. Further, when the maximum Y-coordinate value of the to-be-compared figure is smaller than the Y-coordinate value of the lower side of the to-be-judged group at step 218, there is no probability of intersecting relationship between the two trapezoidal figures. At step 222, therefore, it is judged whether there exists a trapezoidal figure next to the trapezoidal figure that is now used as the to-be-compared figure. When a next trapezoidal figure exists, this next trapezoidal figure is used as a new to-be-compared figure and the routine returns back to the step 210. When a next trapezoidal figure does not exist, it is so presumed that the judgement of intersecting relationship has ended between the present to-be-judged figure and the trapezoidal figure in the present to-be-compared group, and the routine goes out of the loop of repetitively processing trapc.

When the minimum X-coordinate value of the to-be-compared figure is greater than the maximum X-coordinate value of the to-be-judged figure (when the to-be-compared figure exists on the right side of the to-be-judged figure) as a result of judgement at step 210, it is obvious that there is no probability of intersection between the above two trapezoidal figures and there is no probability of intersection between the to-be-judged figure and the trapezoidal figure sorted in the to-be-compared group following the present to-be-compared figure. In the case of this judgement, therefore, it is so presumed that the judgement of intersecting relationship has ended between the present to-be-judged figure and the trapezoidal figure in the present to-be-compared group like when there is no next trapezoidal figure at step 212 or 222, and the routine goes out of the loop of repetitively processing the trapc.

Here, in judging the intersecting relationship between a to-be-judged figure (presumed to be a figure S) and a trapezoidal figure included in a to-be-compared group, when the to-be-compared group includes a trapezoidal figure (presumed to be a figure U) that is processed through step 212 for judging the intersecting relationship between a to-be-judged figure (presumed to be a figure T) just preceding the to-be-judged figure and a trapezoidal figure in the to-be-compared group, then, the figure U never intersects the to-be-judged figure (figure S) without the need of judging the intersecting relationship relative to the figure S which is the to-be-judged figure. This is because, the trapezoidal figures included in each of the groups are sorted based on a minimum X-coordinate value, and there is the following relationship, i.e., the minimum X-coordinate value of the figure T<the minimum X-coordinate value of the figure S.

Therefore, the figure to be compared first in a to-be-compared group with a to-be-judged figure, is selected to be a trapezoidal figure that is sorted first among the trapezoidal figures in the remaining to-be-compared groups by excluding the trapezoidal figures processed through step 212, i.e., by excluding the trapezoidal figures of which the maximum X-coordinate values are smaller than the minimum X-coordinate value of the to-be-judged figure from the trapezoidal figures in the to-be-compared group that is judged for its intersecting relationship with a to-be-judged figure just preceding the above to-be-judged figure. Then, the intersecting relationship needs be judged for a decreased number of trapezoidal figures, making it possible to efficiently judge the intersection.

As a result of judging the intersection at step 210, it is probable that there may appear a trapezoidal figure that is judged to intersect first with the to-be-judged figure among the trapezoidal figures included in the to-be-compared group, or that there is no trapezoidal figure that intersects and the trapezoidal figures included in the to-be-compared group all exist on the right side of the to-be-judged figure. In such a case, when there first appears a trapezoidal figure that is judged to be located on the right side of the to-be-judged figure, then, this trapezoidal figure is stored and is used as the first to-be-compared figure for the next to-be-judged figure.

The above processing is executed through steps 214 and 216 or through steps 224 and 226 in FIG. 3. That is, when a to-be-compared figure of the above-mentioned conditions appear after the routine has jumped into the loop of repetitively processing the trapc with nexttop in a null state, the trapezoidal figure (identifier, etc. of the trapezoidal figure) which is the to-be-compared figure in the to-be-compared group is stored in nexttop. After the identifier of the trapezoidal figure is once stored in nexttop to get out of the null state, the stored content of nexttop is not updated unless the to-be-judged figure changes.

The routine proceeds to step 228 after it has got out of the loop of repetitively processing trapc.

At step 228, it is judged whether nexttop is in the null state.

When nexttop is not in the null state, i.e., when nexttop is storing an identifier of a trapezoidal figure that is to be compared first with the next to-be-judged figure, a trapezoidal figure next to the present to-be-judged figure is used as a new to-be-judged figure at step 230. The routine then returns back again to step 210 where the intersecting relationship is judged between this new to-be-judged figure and trapezoidal figures that follow the trapezoidal figure stored in nexttop included in the to-be-compared group.

When it is judged at step 228 that nexttop is in the null state or at step 230 that a trapezoidal figure that is to be used as a new to-be-judged figure no longer exists in the present to-be-judged group, the routine goes out of the loop of repetitively processing trapn. The routine goes out of the loop of repetitively processing trapn when nexttop is in the null state at step 228 because when the nexttop is in the null state, the trapezoidal figures in the to-be-compared group are all located on the right side of the present to-be-judged figure along the X-axis. Without the need of actually judging the intersecting relationship, therefore, there is no probability of intersection relative to any trapezoidal figure included in the to-be-compared group though there are still remaining trapezoidal figures in the to-be-judged groups that have not still been judged for their intersecting relationship relative to the trapezoidal figures in the to-be-compared group.

Next, it is judged at step 232 whether the group next to the group which is now used as the to-be-compared group exists between it and the to-be-judged group. When there still exists a next group as a result of judgement at step 232, this next group is used as a new to-be-compared group, and the routine returns back to step 202. When a next group does not exist, it means that the judgement of the intersecting relationship has all finished between the trapezoidal figure included in the to-be-judged group and the trapezoidal figures included in all groups which are sorted earlier than the to-be-judged group. The routine, then, goes out of the loop of repetitively processing check Y bone, and the inter-group judging step ends.

Though various preferred embodiments of the invention were described above, it should be noted that the invention is in no way limited to the above embodiments only but can be modified in various ways, such as detecting maximum Y-coordinate values of the groups at the time of classifying the trapezoidal figures into groups without departing from the spirit and stope of the invention.

In the intra-group judging step according to the graphic method of the present invention, the time-consuming intersection judgement processing is not executed for the figures from the first time but, instead, a maximum X-coordinate value of a to-be-judged figure is compared with a minimum X-coordinate value of a to-be-compared figure, which is easy to process, and the intersection judgement processing is executed when the maximum X-coordinate value of the to-be-judged figure is greater than the minimum X-coordinate value of the to-be-compared figure, i.e., only when there is a probability of intersection. Therefore, the intersection judgement processing needs not be executed for the figures that obviously have no probability of intersection. Similarly, further, the intersection judgement processing in the to-be-judged group is terminated when the maximum X-coordinate value of the to-be-judged figure becomes smaller than the minimum X-coordinate value of the to-be-compared figure and there is obviously no probability of intersection. Accordingly, the processing time can be shortened as compared to when the intersection judgement processing is executed for all figures in the to-be-judged group.

In the inter-group judging step, further, a Y-coordinate value of the lower side of a trapezoidal figure included in the to-be-judged group is compared with a maximum Y-coordinate value of a trapezoidal figure included in the to-be-compared group, which is easy to process, at the time of judging the intersection between the two groups, i.e., between trapezoidal figure in the to-be-judged group and the trapezoidal figure in the to-be-compared group, and the intersection judgement processing is executed between the trapezoidal figure included in the to-be-judged group and the trapezoidal figure included in the to-be-compared group only when the Y-coordinate value of the lower side of the to-be-judged group is smaller than the maximum Y-coordinate value of the to-be-compared group, i.e., only when there is a probability of intersection. Therefore, the intersection judgement processing is not executed for the trapezoidal figures included in the groups which apparently have no probability of intersection. Thus, the processing time can be shortened as compared with when the intersection judgement processing is executed for all of the trapezoidal figures included in the two groups.

It is therefore possible to judge the intersecting relationships between large amounts of figures at high speed.

What is claimed is:

1. A method of synthesizing a masking layer on a semiconductor surface in the production of large-scale integrated circuits comprising the steps of:

mapping proposed structures for the semiconductor surface and converting the proposed structures into hypothetical trapezoidal figures having upper and lower sides in parallel with an X-axis on a numerical coordinate grid comprising the X-axis and a Y-axis;

repeatedly determining locations of intersection of selected figures of the masking layer and removing a portion of at least one intersecting figure until there are no intersecting figures to obtain a mask plan with no intersecting figures; and synthesizing a masking layer into a mask according to the mask plan with no intersecting figures, wherein the step of determining locations of intersecting figures of the masking layer includes the steps of:

grouping the trapezoidal figures into a plurality of groups, wherein the figures are grouped such that all figures within a group have the lower sides of the same Y-coordinate values;

sorting the groups into a series of sorted groups based on the Y-coordinate values of said lower sides;

sorting the trapezoidal figures within each group based on minimum X-coordinate values of the trapezoidal figures;

selecting a to-be-judged group from the groups in order of sorting;

performing an intra-group judging step using any one of said trapezoidal figures included in said to-be-judged group as a to-be-judged figure in order of sorting, using any other trapezoidal figures in said to-be-judged group sorted after said to-be-judged figure as a to-be-compared figure successively in order of sorting, and repetitively executing an intersection judgement processing only when a maximum X-coordinate value of the to-be-judged figure is greater than a minimum X-coordinate value of the to-be-compared figure while comparing the maximum X-coordinate value of the to-be-judged figure with the minimum X-coordinate value of said to-be-compared figure until the maximum X-coordinate value of the to-be-judged figure becomes smaller than the minimum X-coordinate value of the to-be-compared figure or until the minimum X-coordinate of the to-be-compared figure equals the maximum X-coordinate of the to-be-compared figure and the to-be-compared figure disappears;

performing an inter-group judging step for using any one of said group sorted before said to-be-judged group as a to-be-compared group in order of sorting, said judging step comprising comparing the Y-coordinate values of the lower sides of the trapezoidal figures included in said first to-be-judged group with a maximum Y-coordinate value of a trapezoidal figure included in said to-be-compared group, and executing the intersection judgement processing between the trapezoidal figures included in said to-be-judged group and the trapezoidal figures included in said to-be-compared group only when the Y-coordinate value of the lower side of said to-be-judged group is smaller than said maximum Y-coordinate value of said to-be compared group; and repeating said selecting a to-be-judged group step through said performing an inter-group judging step until there is no group that can be used as said to-be-judged group in said to-be-judged group-determining step.

2. A method according to claim 1, wherein said performing an inter-group judging step uses any one of the trapezoidal figures included in the to-be-judged group as a to-be-judged figure successively in order of sorting, uses any one of the trapezoidal figures included in the to-be-compared group as a to-be-compared figure successively in order of sorting when the Y-coordinate value of the lower side of the to-be-judged group is smaller than a maximum Y-coordinate value of the to-be-compared group, judges the intersecting relationship between said to-be-judged figure and said to-be-compared figure along the direction of the X-axis, judges when the maximum Y-coordinate value of the to-be-compared figure is greater than the Y-coordinate value of the lower side of the to-be-judged group only when there is a probability of intersection, and executes the intersection judgement processing between the to-be-judged figure and the to-be-compared figure only when the maximum Y-coordinate value of the to-be-compared figure is greater than the Y-coordinate value of the lower side of the to-be-judged group.

3. A method according to claim 2, wherein a to-be-compared figure that is compared first with a to-be-judged figure in the inter-group judging step is a trapezoidal figure which is sorted first among the trapezoidal figures in the to-be-compared group that is judged for its intersecting relationship with a to-be-judged figure just preceding said to-be-judged figure, but excluding those trapezoidal figures of which maximum X-coordinate values are smaller than the minimum X-coordinate value of the to-be-judged figure.

4. An apparatus for planning a mask from inputted proposed structures for a semiconductor surface comprising a program for:

mapping proposed structures for the semiconductor surface and converting the proposed structures into hypothetical trapezoidal figures having upper and lower sides in parallel with an X-axis on a numerical coordinate grid comprising the X-axis and a Y-axis;

determining locations of intersecting figures of the masking layer and removing portions of intersecting figure to obtain a mask plan with no intersecting figures; and synthesizing a mask on a semiconductor surface according to the mask plan wherein the determining locations of intersecting figures of the masking layer follows a program stored in a microprocessor, and the program includes the steps of:

a grouping step for classifying those trapezoidal figures having the lower sides of the same Y-coordinate values into the same groups, sorting the groups based n te Y-coordinate values of said lower sides, sorting the trapezoidal figures included in said groups based on minimum X-coordinate values of the trapezoidal figures, and storing them;

a to-be-judged group-determining step for using any one of said groups as a to-be-judged group in order of sorting;

an intra-group judging step for using any one of said trapezoidal figures included in said to-be-judged group as a to-be-judged figure in order of sorting, using any one of trapezoidal figures in said to-be-judged group sorted after said to-be-judged figure as a to-be-compared figure successively in order of sorting, and repetitively executing an intersection judgement processing only when a maximum X-coordinate value of the to-be-judged figure is greater than a minimum X-coordinate value of the to-be-compared figure while comparing the maximum X-coordinate value of the to-be-judged figure with the minimum X-coordinate value of said to-be-compared figure until the maximum X-coordinate value of the to-be-judged figure becomes smaller than the minimum X-coordinate value of the to-be-compared figure or until the to-be-compared figure disappears; and an inter-group judging step for using any one of said group sorted before said to-be-judged group as a to-be-compared group in order of sorting, comparing the Y-coordinate values of the lower sides of the trapezoidal figures included in said to-be-judged group with a maximum Y-coordinate value of a trapezoidal figure included in said to-be-compared group, and executing the intersection judgement processing between the trapezoidal figures included in said to-be-judged group and the trapezoidal figures included in said to-be-compared group only when the Y-coordinate value of the lower side of said to-be-judged group is smaller than said maximum Y-coordinate value of said to-be-compared group;

said to-be-judged group-determining step through up to said inter-group judging step being repeated until there is no group that can be used as said to-be-judged group in said to-be-judged group-determining step.

5. An apparatus according to claim 4, wherein said inter-group judging step uses any one of the trapezoidal figures included in the to-be-judged group as a to-be-judged figure successively in order of sorting, uses any one of the trapezoidal figures included in the to-be-compared figure successively in order of sorting when the Y-coordinate value of the lower side of the to-be-judged group is smaller than a maximum Y-coordinate value of the to-be-compared group, judges the intersecting relationship between said to-be-judged figure and said to-be-compared figure along the direction of X-axis, judges whether the maximum Y-coordinate value of the to-be-compared figure is greater than the Y-coordinate value of the lower side of the to-be-judged group only when there is a probability of intersection, and executes the intersection judgement processing between the to-be-judged figure and the to-be-compared figure only when the maximum Y-coordinate value of the to-be-compared figure is greater than the Y-coordinate value of the lower side of the to-be-judged group.

6. An apparatus according to claim 5, wherein a to-be-compared figure that is compared first with a to-be-judged figure in the inter-group judging step is a trapezoidal figure which is sorted first among the trapezoidal figures in the to-be-compared group that is judged for its intersecting relationship with a to-be-judged figure just preceding said to-be-judged figure, but excluding those trapezoidal figures of which maximum X-coordinate values are smaller than the minimum X-coordinate value of the to-be-judged figure.

7. A method of synthesizing a mask on a semiconductor surface consisting essentially of the steps of:

providing a map of proposed structures, said map including desired location on the semiconductor surface of said structures and approximate size of said structures, wherein either each structure or the space between structures eventually becomes a portion of the mask;

converting the proposed structures into hypothetical trapezoidal figures having upper and lower sides in parallel with an X-axis on a numerical coordinate grid comprising the X-axis and a Y-axis;

grouping the trapezoidal figures into a plurality of groups, wherein the figures are grouped according to the lower side Y-coordinate values;

sorting the groups based on increasing values of the minimum Y-coordinate values of said lower sides of figures within each group into a series of sorted groups;

sorting the trapezoidal figures within each group based on increasing values of the minimum X-coordinate values of the trapezoidal figures in the group to create internally-sorted groups;

repetitively determining locations of intersection of figures according to sorting, and removing a portion of at least one intersecting trapezoid, until no intersecting figures are found, to obtain a mask plan with no intersecting figures by a process consisting essentially of:

for each group performing an intra-group judging step by:

selecting a to-be-judged figure included in said to-be-judged group in order of sorting, determining whether there is intersection, by executing an intersection judgement processing, of the to-be-judged figure with to-be-compared figures, wherein the to-be-compared figures are figures sorted after said to-be-judged figure in said to-be-judged group by comparing the maximum X-coordinate value of the to-be-judged figure to the minimum X-coordinate value of the to-be-compared figures, wherein if intersection is found a portion of an intersecting figure is incrementally removed by decreasing the maximum X-coordinate value of the to-be-judged figure or by increasing the minimum X-coordinate value of the to-be-compared figure and the determining whether there is intersection step is repeated for that to-be-judged figure until no intersection is found because the maximum X-coordinate value of the to-be-judged figure is less than the minimum X-coordinate value of the to-be-compared figure or because the minimum and maximum X-coordinate values of the an intersecting figure become equal, then the to-be-judged figure is a judged figure, and repeating the intra-group judging step by selecting the next figure after the judged figure in order of sorting as a to-be-judged figure and repetitively executing the determining whether there is intersection and removing a portion of at least one intersecting figure steps all figures in the group are judged figures;

performing an inter-group judging step with a to-be-judged group and with to-be-compared groups, wherein the to-be-compared groups are groups sorted before said to-be-judged group in order of sorting, said inter-group judging step consisting essentially of:

selecting a to-be-judged group from the series of sorted groups in order of sorting;

determining inter-group intersection by comparing the Y-coordinate values of the lower sides of the trapezoidal figures included in said to-be-judged group with a maximum Y-coordinate value of a trapezoidal figure included in said to-be-compared group, by executing an intersection judgement processing, wherein if intersection is found a portion of an intersecting figure is incrementally removed by decreasing the maximum Y-coordinate value of the to-be-compared figure and/or a portion of the intersecting group is removed by increasing the minimum Y-coordinate value of determining inter-group intersection for that to-be-judged group until no intersection is found because the maximum Y-coordinate value of the to-be-compared figure is less than the minimum Y-coordinate value of the to-be-judged group or because the minimum and maximum Y-coordinate values of the intersecting figure become equal, and then the to-be-judged group is a judged group, and repeating said inter-group judging step by selecting the next group after the judged group in order of sorting as a to-be-judged group and repetitively executing the determining inter-group intersection and removing a portion of an intersecting figure steps until all groups are judged groups and there is no group that can be used as a to-be-judged group, wherein the resulting figures on the coordinate grid represent a mask plan; and synthesizing a mask layer according to the mask plan.

8. The method of synthesizing a mask on a semiconductor surface of claim 7 wherein the trapezoidal figures are grouped into a plurality of groups, wherein the figures in each group have the same minimum Y-coordinate values.

9. The method of synthesizing a mask on a semiconductor surface of claim 7 wherein said performing an inter-group judging step uses any one of the trapezoidal figures included in the to-be-judged group as a to-be-judged figure successively in order of sorting, uses any one of the trapezoidal figures included in the to-be-compared group as a to-be-compared figure successively in order of sorting when the Y-coordinate value of the lower side of the to-be-judged group is smaller than a maximum Y-coordinate value of the to-be-compared group, judges the intersecting relationship between said to-be-judged figure and said to-be-compared figure along the direction of the X-axis, judges when the maximum Y-coordinate value of the to-be-compared figure is greater than the Y-coordinate value of the lower side of the to-be-judged group only when there is a probability of intersection, and executes the intersection judgement processing between the to-be-judged figure and the to-be-compared figure only when the maximum Y-coordinate value of the to-be-compared figure is greater than the Y-coordinate value of the lower side of the to-be-judged group.

10. The method of synthesizing a mask on a semiconductor surface of claim 7 wherein a to-be-compared figure that is compared first with a to-be-judged figure in the inter-group judging step is a trapezoidal figure which is sorted first among the trapezoidal figures in the to-be-compared group that is judged for its intersecting relationship with a to-be-judged figure just preceding said to-be-judged figure, but excluding those trapezoidal figures of which maximum X-coordinate values are smaller than the minimum X-coordinate value of the to-be-judged figure.

11. The method of synthesizing a mask on a semiconductor surface of claim 7 wherein the steps of:

converting the proposed structures into hypothetical trapezoidal figures;

grouping the trapezoidal figures into a plurality of groups;

sorting the groups into a series of sorted groups;

sorting the trapezoidal figures within each group to create internally-sorted groups; and repetitively determining locations of intersection of figures according to sorting, and removing a portion of at least one intersecting trapezoid, until no intersecting figures are found, are performed by an apparatus comprising a recorded medium containing a program comprising instructions for completing said steps.

\* \* \* \* \*

UNITED STATES PATENT AND TRADEMARK OFFICE
CERTIFICATE OF CORRECTION

PATENT NO.     : 6,535,222 B1  
DATED          : May 30, 2003  
INVENTOR(S)    : Kiyotaka Mochizuki It is certified that error appears in the above-identified patent and that said Letters Patent is hereby corrected as shown below:

<u>Title page,</u>
Item [54], the title should read -- METHOD OF PREPARING MASKING LAYER --.

<u>Column 15,</u>
Line 6, change "n te" to -- on the --.

Signed and Sealed this

Twenty-third Day of September, 2003

JAMES E. ROGAN
*Director of the United States Patent and Trademark Office*